(12) United States Patent
Miyoshi et al.

(10) Patent No.: US 6,630,827 B1
(45) Date of Patent: Oct. 7, 2003

(54) PHASE DISTRIBUTION MEASUREMENT METHOD AND APPARATUS, PHASE CORRECTION METHOD AND APPARATUS, AND MAGNETIC RESONANCE IMAGING APPARATUS

(75) Inventors: Mitsuharu Miyoshi, Tokyo (JP); Koichi Oshio, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 485 days.

(21) Appl. No.: 09/685,815

(22) Filed: Oct. 10, 2000

(30) Foreign Application Priority Data

Oct. 22, 1999 (JP) ............................ 11-301077

(51) Int. Cl.$^7$ ................................................ G01V 3/00
(52) U.S. Cl. .................................... 324/307; 324/309
(58) Field of Search ........................... 324/307, 309, 324/300, 312, 314, 318, 322

(56) References Cited

U.S. PATENT DOCUMENTS

| 4,823,085 A | * | 4/1989 | Fuderer et al. ............. 324/312 |
| 4,825,161 A | * | 4/1989 | Barnea et al. .............. 324/309 |
| 5,998,996 A | * | 12/1999 | Bernstein et al. ........... 324/309 |

FOREIGN PATENT DOCUMENTS

| GB | 2304419 | 3/1997 |
| JP | 06098875 | 4/1994 |

* cited by examiner

Primary Examiner—Louis Arana
(74) Attorney, Agent, or Firm—Moonray Kojima

(57) ABSTRACT

To efficiently calculate a precise phase map, phase differentials are calculated for each pixel of pixel data of an image, corresponding integrals are calculated for each pixel, and the phase map is formed using this integral. A phase correction of the image is performed using the phase map, and separate water/lipid images are formed from the phase-corrected image.

16 Claims, 14 Drawing Sheets

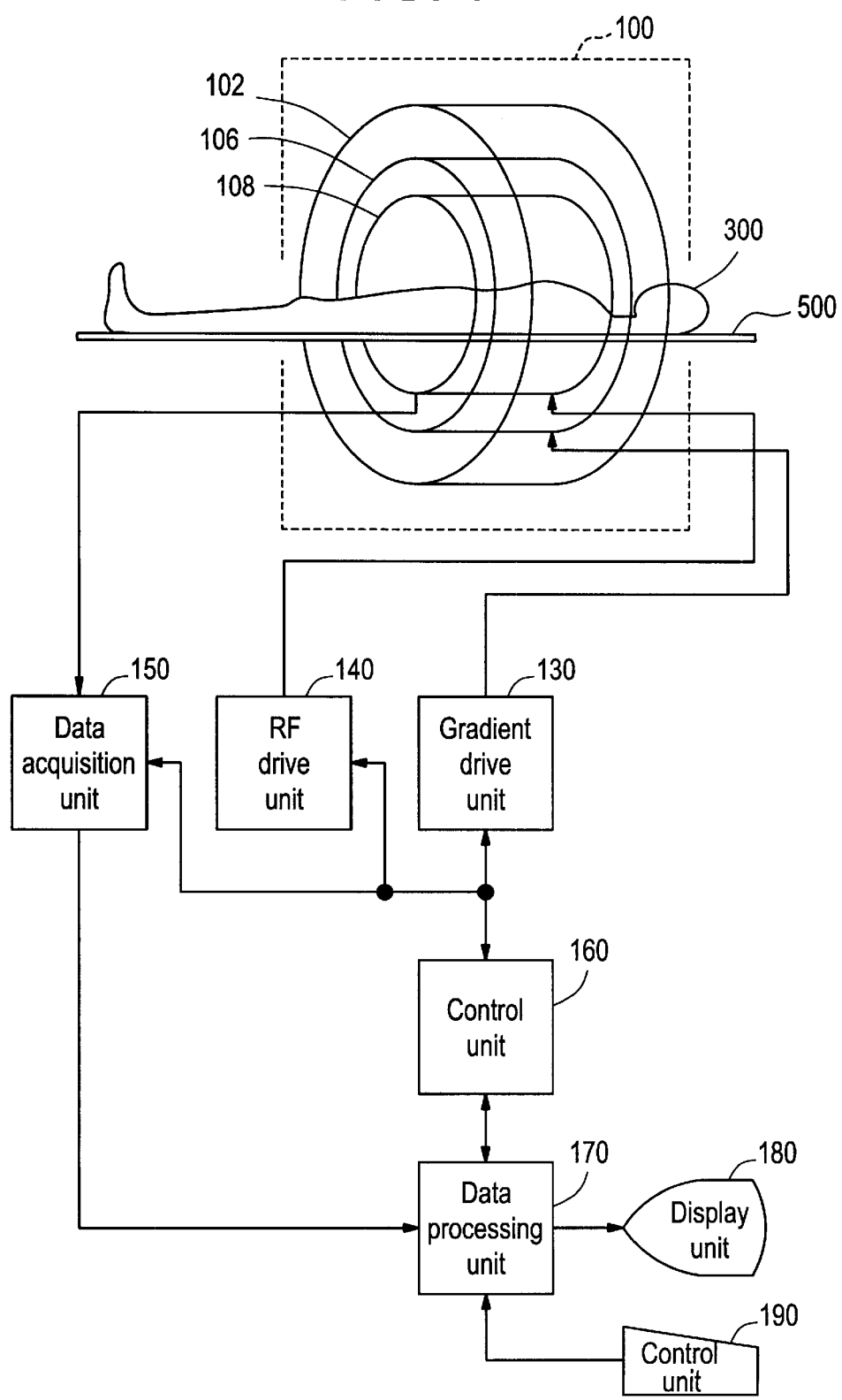

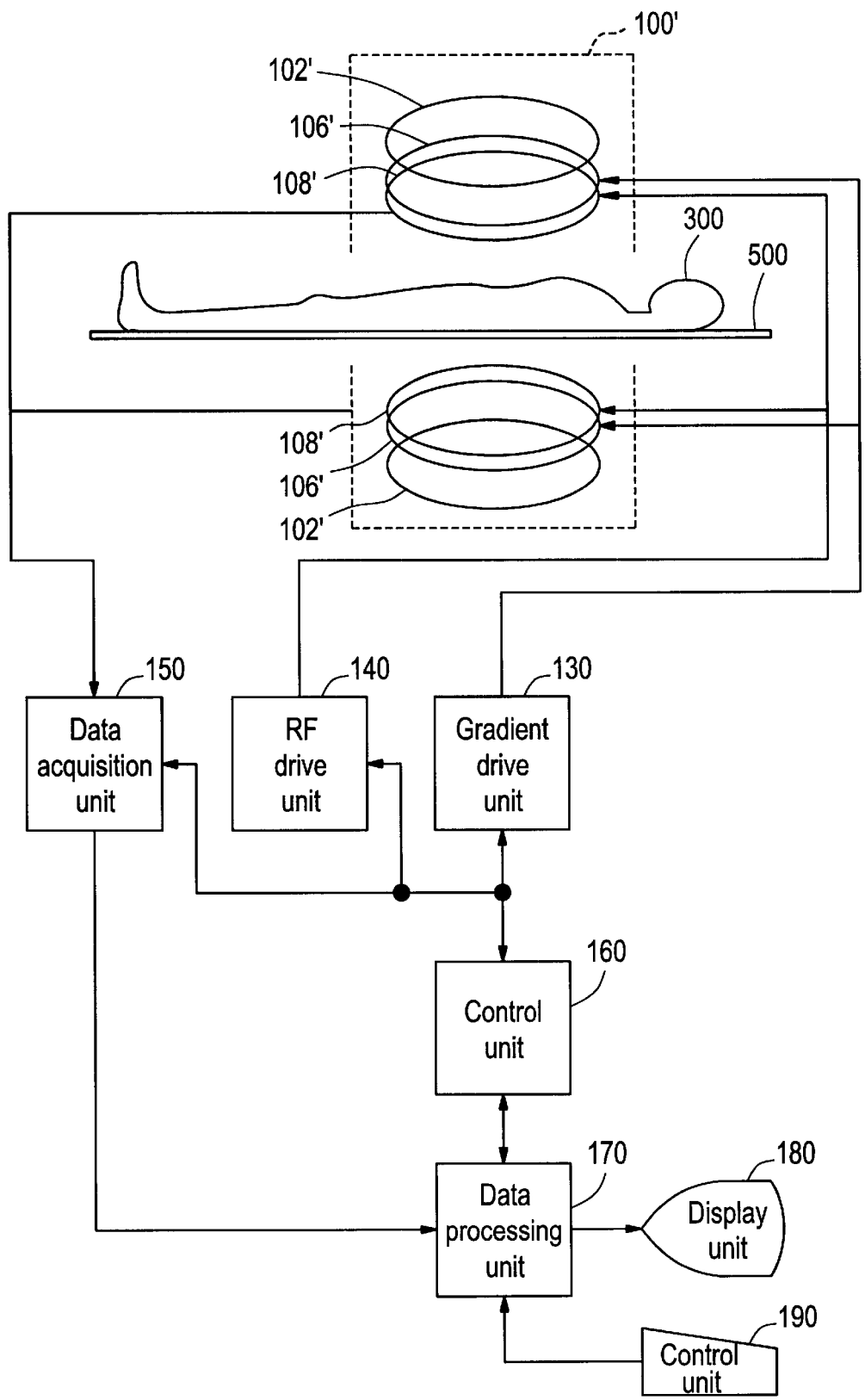

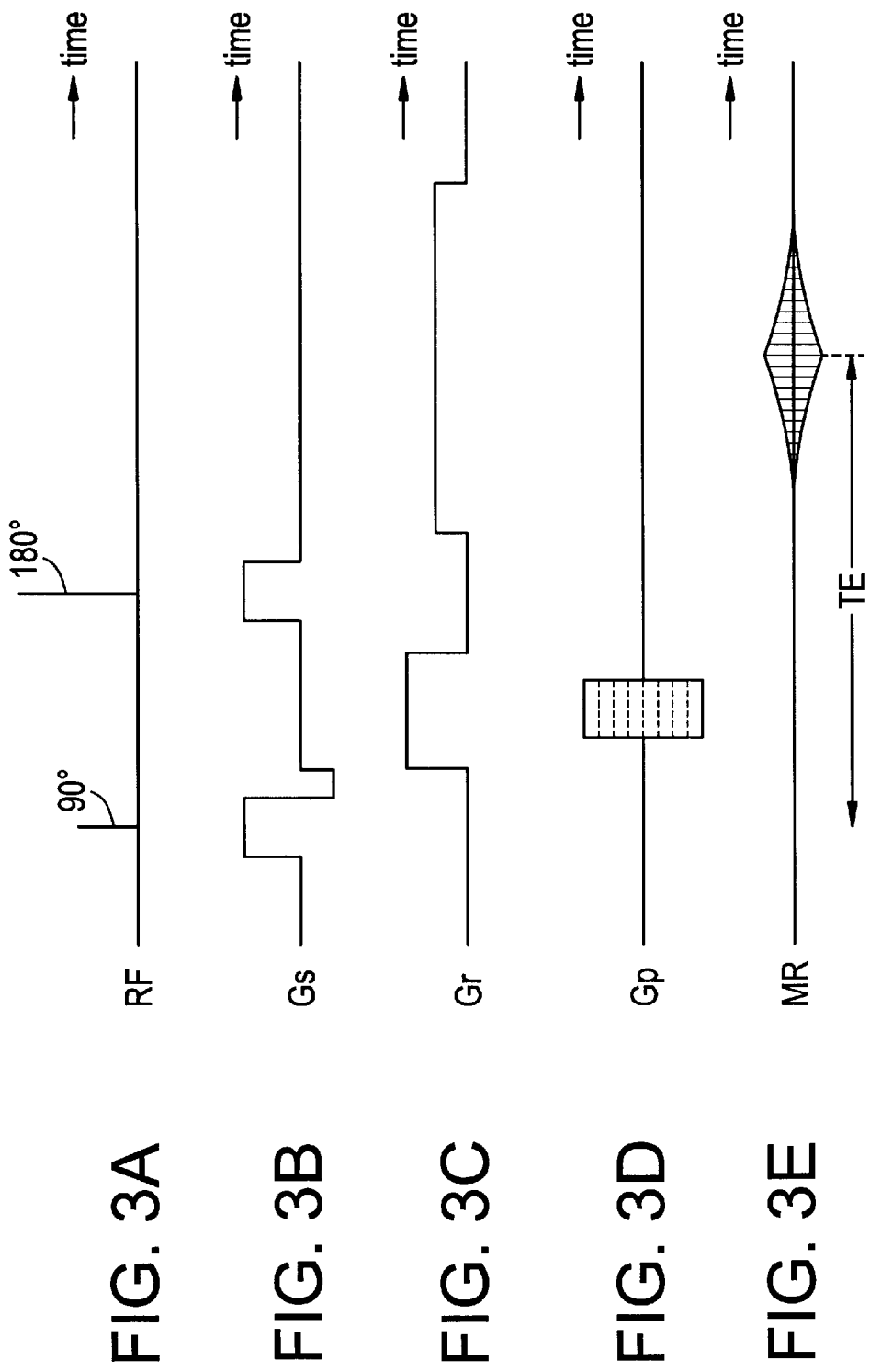

PHASE DISTRIBUTION MEASUREMENT METHOD AND APPARATUS, PHASE CORRECTION METHOD AND APPARATUS, AND MAGNETIC RESONANCE IMAGING APPARATUS

BACKGROUND OF THE INVENTION

This invention relates to a phase distribution measurement method and apparatus, to a phase correction method and apparatus, and to a magnetic resonance imaging apparatus, and more specifically, to a method and apparatus for measuring the phase distribution in an image obtained by magnetic resonance imaging, to a method and apparatus for correcting the phase of pixel data based on the measured phase distribution, and to a magnetic resonance imaging apparatus which obtains water and lipid images based on the phase-corrected pixel data.

In a magnetic resonance imaging apparatus, a stationary magnetic field is formed in a space which accommodates an imaging object, a gradient magnetic field and a high frequency magnetic field are formed in the stationary magnetic field space, and an image is formed (reconstituted) based on a magnetic resonance signal generated by the spin of the imaging object. Due to a chemical shift, the magnetic resonance signal of lipids has a different frequency from the magnetic resonance signal of water, so water and lipids can be imaged separately using a phase difference based on the frequency difference.

The phase of the magnetic resonance signal is affected by the non-uniformity of the stationary magnetic field intensity, so in order to image water and lipids separately without being affected by the magnetic field non-uniformity a phase distribution, i.e. phase map, representing the stationary magnetic field non-uniformity, is calculated, and phase correction of the image is performed based thereon.

The phase map is obtained by calculating the phase of image data given by complex numbers for each pixel. FIG. 16 shows the concept of the phase map for a typical one-dimensional image. The origin of the phase map is taken as the center of the stationary magnetic field. The phase at the origin is 0.

This diagram is a phase map wherein the stationary magnetic field intensity has a linear gradient, and the phase varies linearly according to the distance from the origin. When the phase exceeds $+\pi$, it returns to the $-\pi$ aside, and when it exceeds $-\pi$, it returns to the $+\pi$ side, as shown by (a) in the figure. In other words, a phase wrap around takes place.

Therefore, in parts where there is a wrap around, a correction for wrap around, i.e. unwrapping, is performed to obtain a phase map without wrap around, as shown in (b). The presence or absence of a wrap around is detected by whether or not the absolute value of the phase difference of the image data for adjacent pixels is $2\pi$, and for pixels where a wrap around is detected, $2\pi$ is added to the phase with a reverse sign to that of the phase difference.

The phase map often comprises high order components due to the effect of noise or variation of magnetic susceptibility, etc., so as shown for example by FIG. 17(a), at a point A of the phase map, a phase difference which would have been $2\pi$ may actually be less than this. Therefore, when it is attempted to detect a wrap around in the manner described above, a wrap around cannot be detected at points where it should have been detected, and the resulting phase map is inaccurate as shown in (b).

SUMMARY OF THE INVENTION

It is therefore an object of this invention, which was conceived to overcome the above problem, to provide a phase distribution measurement method and apparatus which efficiently calculate a precise phase map, a phase correction and apparatus using this calculated phase map, and a magnetic resonance imaging apparatus which performs such a phase correction.

(1) The invention from one aspect for solving the aforesaid problem is a phase distribution measurement method characterized by calculating the differentials of the phases of pixel data of an image obtained by magnetic resonance imaging for each pixel, calculating the integrals of the aforesaid differentials for each pixel, and forming a phase distribution from the aforesaid integrals.

In the invention according to this aspect, phase differentials are calculated for each pixel, corresponding integrals are calculated for each pixel, and a phase map is formed from the integrals. In this way, a phase map is obtained in which unwrapping is performed naturally.

(2) The invention from another aspect for solving the aforesaid problem is a phase distribution measurement method characterized by filtering an image obtained by magnetic resonance imaging, calculating the differentials of the phases of pixel data for the filtered image, calculating the integrals of the differentials for each pixel, and forming a phase distribution from the integrals.

In the invention according to this aspect, phase differentials are calculated for each pixel, corresponding integrals are calculated for each pixel, and a phase map is formed from the integrals. Before calculating the differentials, the image is filtered to obtain a phase map which is unaffected by noise. In this way, a phase map is obtained in which unwrapping is performed naturally.

(3) The invention from another aspect for solving the aforesaid problem is a phase distribution measurement method characterized by calculating the differentials of the phases of pixel data of an image obtained by magnetic resonance imaging for each pixel, filtering the differentials, calculating the integrals of the filtered differentials for each pixel, and forming a phase distribution from the aforesaid integrals.

In the invention according to this aspect, phase differentials are calculated for each pixel, corresponding integrals are calculated for each pixel, and a phase map is formed from the integrals. After calculating the differentials, filtering is performed to obtain a phase map unaffected by noise. In this way, a phase map is obtained in which unwrapping is performed naturally.

(4) The invention from another aspect for solving the aforesaid problem is a phase distribution measurement method characterized by calculating the differentials of the phases of pixel data of an image obtained by magnetic resonance imaging or each pixel, calculating the integrals of the aforesaid differentials for each pixel, filtering the integrals, and forming a phase distribution from the aforesaid filtered integrals.

In the invention according to this aspect, phase differentials are calculated for each pixel, corresponding integrals are calculated for each pixel, and a phase map is formed from the integrals. After calculating the integrals, filtering is performed to obtain a phase map unaffected by noise. In this way, a phase map is obtained in which unwrapping is performed naturally.

(5) The invention from another aspect for solving the aforesaid problem is a phase distribution measurement apparatus comprising a means for calculating the differentials of the phases of pixel data of an image obtained by magnetic resonance imaging for each pixel, a means for calculating the integrals of the aforesaid differentials for each pixel, and a means for forming a phase distribution from the aforesaid integral.

In the invention according to this aspect, phase differentials are calculated for each pixel by the differential calculating means, corresponding integrals are calculated for each pixel by the integral calculating means, and a phase map is formed from the integrals by the phase distribution forming means. In this way, a phase map is obtained in which unwrapping is performed naturally.

(6) The invention from another aspect for solving the aforesaid problem is a phase distribution measurement apparatus comprising a filtering means for filtering an image obtained by magnetic resonance imaging, a differential calculating means for calculating the differentials of the phases of pixel data for the filtered image, an integral calculating means for calculating the integrals of the differentials for each pixel, and a phase distribution forming means for forming a phase distribution from the integrals.

In the invention according to this aspect, phase differentials are calculated for each pixel by the differential calculating means, corresponding integrals are calculated for each pixel by the integral calculating means, and a phase map is formed from the integrals by the phase distribution forming means. Before calculating the differentials, the image is filtered by the filtering means to obtain a phase map which is unaffected by noise. In this way, a phase map is obtained in which unwrapping is performed naturally.

(7) The invention from another aspect for solving the aforesaid problem is a phase distribution measurement apparatus comprising a differential calculating means for calculating the differentials of the phases of pixel data of an image obtained by magnetic resonance imaging for each pixel, a filtering means for filtering the differentials, an integral calculating means for calculating the integrals of the filtered differentials for each pixel, and a phase distribution forming means for forming a phase distribution from the aforesaid integrals.

In the invention according to this aspect, phase differentials are calculated for each pixel by the differential calculating means, corresponding integrals are calculated for each pixel by the integral calculating means, and a phase map is formed from the integrals by the phase distribution forming means. After calculating the differentials, filtering is performed by the filtering means to obtain a phase map unaffected by noise. In this way, a phase map is obtained in which unwrapping is performed naturally.

(8) The invention from another aspect for solving the aforesaid problem is a phase distribution measurement apparatus comprising a differential calculating means for calculating the differentials of the phases of pixel data of an image obtained by magnetic resonance imaging for each pixel, an integral calculating means for calculating the integrals of the aforesaid differentials for each pixel, a filtering means for filtering the integrals, and a phase distribution forming means for forming a phase distribution from the aforesaid filtered integrals.

In the invention according to this aspect, phase differentials are calculated for each pixel by the phase differential calculating means, corresponding integrals are calculated for each pixel by the integral calculating means, and a phase map is formed from the integrals by the phase distribution forming means. After calculating the integrals, filtering is performed by the filtering means to obtain a phase map unaffected by noise. In this way, a phase map is obtained in which unwrapping is performed naturally.

(9) The invention from another aspect for solving the aforesaid problem is a phase correction method characterized by calculating the differentials of the phases of pixel data of an image obtained by magnetic resonance imaging for each pixel, calculating the integrals of the differentials for each pixel, forming a phase distribution from the aforesaid integrals, and performing a phase correction of the image by the aforesaid phase distribution.

In the invention according to this aspect, phase differentials are calculated for each pixel, corresponding integrals are calculated for each pixel, and a phase map is formed from the integrals. In this way, a phase map is obtained in which unwrapping is performed naturally. The image data is phase-corrected using this phase map.

(10) The invention from another aspect for solving the aforesaid problem is a phase correction method characterized by filtering an image obtained by magnetic resonance imaging, calculating the differentials of the phases of pixel data of the aforesaid filtered image, calculating the integrals of the differentials for each pixel, forming a phase distribution from the aforesaid integrals, and performing a phase correction of the image by the aforesaid phase distribution.

In the invention according to this aspect, phase differentials are calculated for each pixel, corresponding integrals are calculated for each pixel, and a phase map is formed from the integrals. Before calculating the differentials, the image is filtered to obtain a phase map unaffected by noise. In this way, a phase map is obtained in which unwrapping is performed naturally. The image data is phase-corrected using this phase map.

(11) The invention from another aspect for solving the aforesaid problem is a phase correction method characterized by calculating the differentials of the phases of the pixel data of an image obtained by magnetic resonance imaging for each pixel, filtering the differentials, calculating the integrals of the aforesaid filtered differentials for each pixel, forming a phase distribution from the aforesaid integrals, and performing a phase correction of the image by the aforesaid phase distribution.

In the invention according to this aspect, phase differentials are calculated for each pixel, corresponding integrals are calculated for each pixel, and a phase map is formed from the integrals. After calculating the differentials, the image is filtered to obtain a phase map unaffected by noise. In this way, a phase map is obtained in which unwrapping is performed naturally. The image data is phase-corrected using this phase map.

(12) The invention from another aspect for solving the aforesaid problem is a phase correction method characterized by calculating the differentials of the phases of the pixel data of an image obtained by magnetic resonance imaging for each pixel, calculating the integrals of the aforesaid differentials for each pixel, filtering the aforesaid integrals, forming a phase distribution from the aforesaid filtered integrals, and performing a phase correction of the image by the aforesaid phase distribution.

In the invention according to this aspect, phase differentials are calculated for each pixel, corresponding integrals are calculated for each pixel, and a phase map is formed from the integrals. After calculating the integrals, filtering is performed to obtain a phase map unaffected by noise. In this way, a phase map is obtained in which unwrapping is performed naturally. The image data is phase-corrected using this phase map.

(13) The invention from another aspect for solving the aforesaid problem is a phase correction apparatus comprising differential calculating means for calculating the differentials of the phases of the pixel data of an image obtained by magnetic resonance imaging for each pixel, an integral calculating means for calculating the integrals of the aforesaid differentials for each pixel, a phase distribution forming means for forming a phase distribution from the aforesaid integrals, and a phase correction means for performing a phase correction of the image by the aforesaid phase distribution.

In the invention according to this aspect, phase differentials are calculated for each pixel by the differential calculating means, corresponding integrals are calculated for each pixel by the integral calculating means, and a phase map is formed from the integrals by the phase distribution forming means. In this way, a phase map is obtained in which unwrapping is performed naturally. The image data is phase-corrected by the phase correction means using this phase map.

(14) The invention from another aspect for solving the aforesaid problem is a phase correction apparatus comprising a filtering means for filtering an image obtained by magnetic resonance imaging, a differential calculating means for calculating the differentials of the phases of the pixel data of the aforesaid filtered image for each pixel, an integral calculating means for calculating the integrals of the aforesaid differentials for each pixel, a phase distribution forming means for forming a phase distribution from the aforesaid integrals, and a phase correction means for performing a phase correction of the image by the aforesaid phase distribution.

In the invention according to this aspect, phase differentials are calculated for each pixel by the differential calculating means, corresponding integrals are calculated for each pixel by the integral calculating means, and a phase map is formed from the integrals by the phase distribution forming means. Before calculating the differentials, the image is filtered by the filtering means to obtain a phase map unaffected by noise. In this way, a phase map is obtained in which unwrapping is performed naturally. The image data is phase-corrected by the phase correction means using this phase map.

(15) The invention from another aspect for solving the aforesaid problem is a phase correction apparatus comprising a differential calculating means for calculating the differentials of the phases of the pixel data of an image obtained by magnetic resonance imaging for each pixel, a filtering means for filtering the aforesaid differentials, an integral calculating means for calculating the integrals of the aforesaid filtered differentials for each pixel, a phase distribution forming means for forming a phase distribution from the aforesaid integrals, and a phase correction means for performing a phase correction of the image by the aforesaid phase distribution.

In the invention according to this aspect, phase differentials are calculated for each pixel by the differential calculating means, corresponding integrals are calculated for each pixel by the integral calculating means, and a phase map is formed from the integrals by the phase distribution forming means. After calculating the differentials, the image is filtered by the filtering means to obtain a phase map unaffected by noise. In this way, a phase map is obtained in which unwrapping is performed naturally. The image data is phase-corrected by the phase correction means using this phase map.

(16) The invention from another aspect for solving the aforesaid problem is a phase correction apparatus comprising a differential calculating means for calculating the differentials of the phases of the pixel data of the image obtained by magnetic resonance imaging for each pixel, an integral calculating means for calculating the integrals of the aforesaid differentials for each pixel, a filtering means for filtering the aforesaid integrals, a phase distribution forming means for forming a phase distribution from the aforesaid filtered integrals, and a phase correction means for performing a phase correction of the image by the aforesaid phase distribution.

In the invention according to this aspect, phase differentials are calculated for each pixel by the differential calculating means, corresponding integrals are calculated for each pixel by the integral calculating means, and a phase map is formed from the integrals by the phase distribution forming means. After calculating the integrals, the image is filtered by the filtering means to obtain a phase map unaffected by noise. In this way, a phase map is obtained in which unwrapping is performed naturally. The image data is phase-corrected by the phase correction means using this phase map.

(17) The invention from another aspect for solving the aforesaid problem is a magnetic resonance imaging apparatus comprising an imaging means for forming an image of each imaging object using magnetic resonance, a differential calculating means which calculates the differentials of the phases of the pixel data of the aforesaid image for each pixel, an integral calculating means which calculates the integrals of the aforesaid differentials for each pixel, a phase distribution forming means which forms a phase distribution from the aforesaid integrals, a correction means which performs a phase correction of the image by the aforesaid phase distribution, and an image-forming means for separately generating a water image and a lipid image using the phase differences of pixel data of the phase-corrected image.

In the invention according to this aspect, phase differentials are calculated for each pixel by the differential calculating means, corresponding integrals are calculated for each pixel by the integral calculating means, and a phase map is formed from the integrals by the phase distribution forming means. In this way, a phase map is obtained in which unwrapping is performed naturally. The image data is phase-corrected by the phase correction means using this phase map. Water and lipids are separately imaged by the image generating means based on the phase-corrected image data.

(18) The invention from another aspect for solving the aforesaid problem is a magnetic resonance imaging apparatus comprising imaging means for forming an image of each imaging object using magnetic resonance, a filtering means for filtering the aforesaid image, a differential calculating means for calculating the differentials of the phases of the pixel data of the aforesaid filtered image for each pixel, an integral calculating means for calculating the integrals of the aforesaid differentials for each pixel, a phase distribution forming means for forming a phase distribution from the aforesaid integrals, a phase correction means for performing a phase correction of the image by the aforesaid phase distribution, and an image-forming means for separately generating a water image and a lipid image using the phase differences of the pixel data of the phase-corrected image.

In the invention according to this aspect, phase differentials are calculated for each pixel by the differential calculating means, corresponding integrals are calculated for each pixel by the integral calculating means, and a phase map is formed from the integrals by the phase distribution forming means. Before calculating the differentials, the image is filtered by the filtering means to obtain a phase map unaffected by noise. In this way, a phase map is obtained in which unwrapping is performed naturally. The image data is phase-corrected by the phase correction means using this phase map. Water and lipids are separately imaged by the image generating means based on the phase-corrected image data.

(19) The invention from another aspect for solving the aforesaid problem is a magnetic resonance imaging apparatus comprising an imaging means for forming an image of each imaging object using magnetic resonance, a differential calculating means for calculating the differentials of the phases of the pixel data of the aforesaid filtered image for each pixel, a filtering means for filtering the aforesaid differentials, an integral calculating means for calculating the integrals of the aforesaid filtered differentials for each pixel, a phase distribution forming means for forming a phase distribution from the aforesaid integrals, a phase correction means for performing a phase correction of the image by the aforesaid phase distribution, and an image-forming means for separately generating a water image and a lipid image using the phase differences of the pixel data of the phase-corrected image.

In the invention according to this aspect, phase differentials are calculated for each pixel by the differential calculating means, corresponding integrals are calculated for each pixel by the integral calculating means, and a phase map is formed from the integrals by the phase distribution forming means. After calculating the differentials, the image is filtered by the filtering means to obtain a phase map unaffected by noise. In this way, a phase map is obtained in which unwrapping is performed naturally. The image data is phase-corrected by the phase correction means using this phase map. Water and lipids are separately imaged by the image generating means based on the phase-corrected image data.

(20) The invention from another aspect for solving the aforesaid problem is a magnetic resonance imaging apparatus comprising an imaging means for forming an image of each imaging object using magnetic resonance, a differential calculating means for calculating the differentials of the phases of the pixel data of the aforesaid image for each pixel, an integral calculating means for calculating the integrals of the aforesaid differentials for each pixel, a filtering means for filtering the aforesaid integrals, a phase distribution forming means for forming a phase distribution from the aforesaid integrals, a phase correction means for performing a phase correction of the image by the aforesaid phase distribution, and an image-forming means for separately generating a water image and a lipid image using the phase differences of the pixel data of the phase corrected image.

In the invention according to this aspect, phase differentials are calculated for each pixel by the differential calculating means, corresponding integrals are calculated for each pixel by the integral calculating means, and a phase map is formed from the integrals by the phase distribution forming means. After calculating the integrals, the image is filtered by the filtering means to obtain a phase map unaffected by noise. In this way, a phase map is obtained in which unwrapping is performed naturally. The image data is phase-corrected by the phase correction means using this phase map. Water and lipids are separately imaged by the image generating means based on the phase-corrected image data.

(21) The invention from another aspect for solving the aforesaid problem is a magnetic resonance imaging method characterized by forming an image using magnetic resonance for each imaging object, calculating the differentials of the phases of the pixel data of the image formed for each pixel, calculating the integrals of the aforesaid differentials for each pixel, forming a phase distribution from the aforesaid integrals, performing a phase correction of the image by the aforesaid phase distribution, and separately generating a water image and a lipid image using the phase differences of the pixel data of the phase-corrected image.

In the invention according to this aspect, phase differentials are calculated for each pixel for each image obtained by magnetic resonance imaging, corresponding integrals are calculated for each pixel, and a phase map is formed from the integrals. In this way, a phase map is obtained in which unwrapping is performed naturally. The image data is phase-corrected using this phase map. Water and lipids are separately imaged by the image generating means based on the phase-corrected image data.

(22) The invention from another aspect for solving the aforesaid problem is a magnetic resonance imaging method characterized by forming an image using magnetic resonance for each imaging object, filtering the image, calculating the differentials of the phases of the pixel data of the filtered image formed for each pixel, calculating the integrals of the aforesaid differentials for each pixel, forming a phase distribution from the aforesaid integrals, performing a phase correction of the image by the aforesaid phase distribution, and separately generating a water image and a lipid image using the phase differences of the pixel data of the phase-corrected image.

In the invention according to this aspect, phase differentials are calculated for each pixel for each image obtained by magnetic resonance imaging, corresponding integrals are calculated for each pixel, and a phase map is formed from the integrals. Before calculating the differentials, the image is filtered to obtain a phase map unaffected by noise. In this way, a phase map is obtained in which unwrapping is performed naturally. The image data is phase-corrected using this phase map. Water and lipids are separately imaged by the image generating means based on the phase-corrected image data.

(23) The invention from another aspect for solving the aforesaid problem is a magnetic resonance imaging method characterized by forming an image using magnetic resonance for each imaging object, calculating the differentials of the phases of the pixel data of the image formed for each pixel, filtering the differentials, calculating the integrals of the aforesaid filtered differentials for each pixel, forming a phase distribution from the aforesaid integrals, performing a phase correction of the image by the aforesaid phase distribution, and separately generating a water image and a lipid image using the phase differences of the pixel data of the phase-corrected image.

In the invention according to this aspect, phase differentials are calculated for each pixel for each image obtained by magnetic resonance imaging, corresponding integrals are calculated for each pixel, and a phase map is formed from the integrals. After calculating the differentials, filtering is performed by the filtering means to obtain a phase map unaffected by noise. In this way, a phase map is obtained in which unwrapping is performed naturally. The image data is phase-corrected using this phase map. Water and lipids are separately imaged by the image generating means based on the phase-corrected image data.

(24) The invention from another aspect for solving the aforesaid problem is a magnetic resonance imaging method characterized by forming an image using magnetic resonance for each imaging object, calculating the differentials of the phases of the pixel data of the image formed for each pixel, calculating the integrals of the aforesaid differentials for each pixel, filtering the integrals, forming a phase distribution from the aforesaid filtered integrals, performing a phase correction of the image by the aforesaid phase distribution, and separately generating a water image and a lipid image using the phase differences of the pixel data of the phase-corrected image.

In the invention according to this aspect, phase differentials are calculated for each pixel for each image obtained by magnetic resonance imaging, corresponding integrals are calculated for each pixel, and a phase map is formed from the integrals. After calculating the integrals, filtering is performed to obtain a phase map unaffected by noise. In this way, a phase map is obtained in which unwrapping is performed naturally. The image data is phase-corrected using this phase map. Water and lipids are separately imaged by the image generating means based on the phase-corrected image data.

As described in detail above, according to this invention, a phase distribution measurement method and apparatus for efficiently calculating a precise phase map, a phase correction method and apparatus using the phase map thus calculated, and a magnetic resonance imaging apparatus which performs this phase correction, can be obtained.

Further objects and advantages of the present invention will be apparent from the following description of the preferred embodiments of the invention as illustrated in the accompanying drawings.

DESCRIPTION OF THE DRAWINGS

FIG. 1 is a block diagram of an apparatus according to one embodiment of this invention.

FIG. 2 is a block diagram of an apparatus according to one embodiment of this invention.

FIGS. 3(A)–3(E) are a diagram showing an example of a pulse sequence executed by the apparatus shown in FIG. 1 or FIG. 2.

DETAILED DESCRIPTION OF THE INVENTION

Figure 4A:
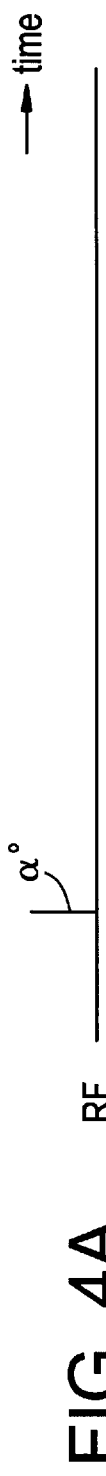
FIGS. 4(A)–4(E) are a diagram showing an example of a pulse sequence executed by the apparatus shown in FIG. 1 or FIG. 2.
Figure 4B:
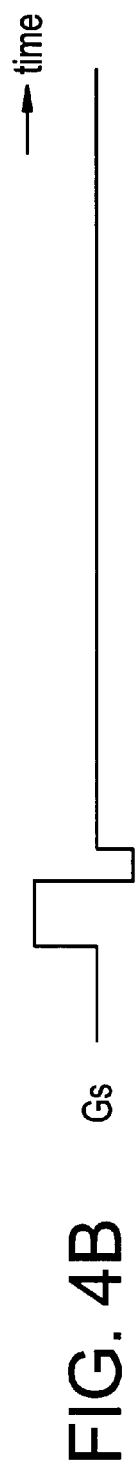
Figure 4C:
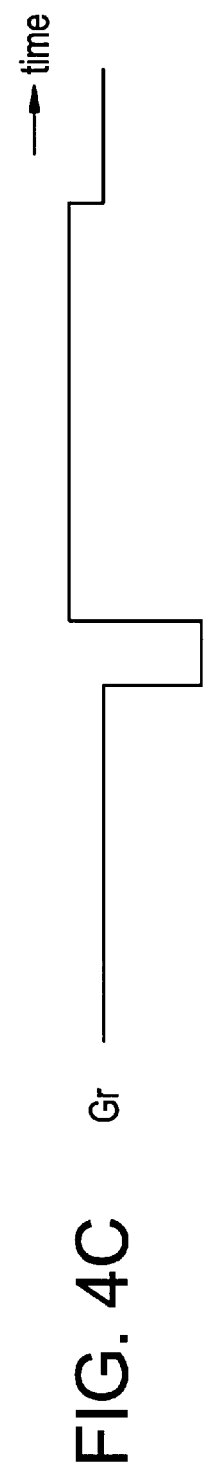
Figure 4D:
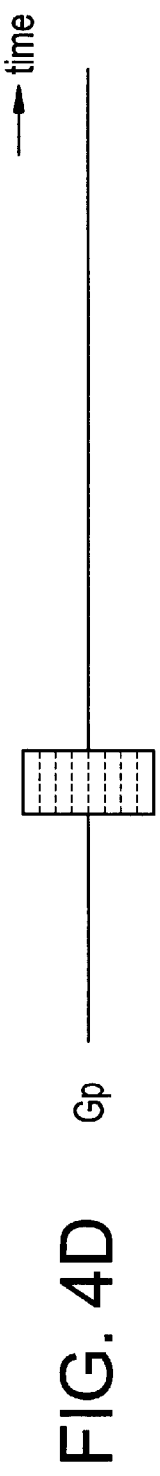
Figure 4E:

Some embodiments of this invention will now be described in detail referring to the drawings.

A block diagram of a magnetic resonance imaging apparatus is shown in FIG. 1. This apparatus is an example of an embodiment of this invention. An example of an embodiment relating to the apparatus of this invention is shown by the construction of this apparatus. An example of an embodiment relating to the method of this invention is shown by the operation of this apparatus. As shown in FIG. 1, this apparatus comprises a magnet system 100. The magnet system 100 comprises a magnetic field coil unit 102, gradient coil unit 106, and RF (radio frequency) coil unit 108. Each of these coil units has an essentially cylindrical shape, and they are arranged coaxial with each other. An imaging object 300 is mounted on a cradle 500, and is transported in and out of the space inside the magnet system 100 by a transport system, not shown.

A main magnetic field coil unit 102 forms a stationary magnetic field in the internal space of the magnet system 100. The direction of the stationary magnetic field is essentially parallel to the axis of the imaging object 300, i.e., a so-called horizontal magnetic field is formed. The main magnetic field coil unit 102 is constructed of, for example, a superconducting coil.

It is understood however that it is not limited to a superconducting coil, and may be constructed also of a permanent conduction coil or the like.

A gradient coil unit 106 generates a gradient magnetic field for giving a gradient to the stationary magnetic field intensity. There are three types of gradient magnetic field generated, i.e., a slice gradient magnetic field, a read-out gradient magnetic field and a phase encode gradient magnetic field, and the gradient coil unit 106 comprises three systems of gradient coils, not shown, corresponding to these three types of gradient magnetic fields.

The RF coil unit 108 forms a high frequency magnetic field for exciting a spin inside the imaging object 300 in the stationary magnetic field space. Hereafter, the forming of the high frequency magnetic field will be referred to as the sending of a RF excitation signal. The RF coil unit also 108 receives an electromagnetic wave, i.e., a magnetic resonance signal, generated by the excited spin. The RF coil unit 108 comprises a sending coil, not shown, and a receiving coil, not shown. The same coil may be used for the sending and receiving coils, or dedicated coils may be used for each.

A gradient drive unit 130 is connected to the gradient coil unit 106. The gradient drive unit 130 supplies a drive signal to the gradient coil unit 106 to generate the gradient magnetic field. The gradient drive unit 130 comprises three drive circuits, not shown, corresponding to the three gradient coils in the gradient coil unit 106.

An RF drive unit 140 is connected to the RF coil unit 108. The RF drive unit 140 supplies a drive signal to the RF coil unit 108, transmits an RF excitation signal, and excites the spin inside the imaging object 300.

A data acquisition unit 150 is connected to the RF coil unit 108. The data acquisition unit 150 acquires the signal received by the RF coil unit 108, and collects it as digital data.

A control unit 160 is connected to the gradient drive unit 130, RF drive unit 140 and data acquisition unit 150. The control unit 160 respectively controls the gradient drive unit 130 or the data acquisition unit 150, respectively.

The output side of the data acquisition unit 150 is connected to a data processing unit 170. The data processing unit 170 stores data acquired from the data acquisition unit 150 in a memory, not shown. A data space is formed in the memory. The data space comprises a two-dimensional Fourier space. The data processing unit 170 transforms data in this two-dimensional Fourier space so as to reconstitute an image of the imaging object 300.

The data processing unit 170 is connected to the control unit 160. The data processing unit 170 is situated above the control unit 160, and controls it. A display unit 180 and an operating unit 190 are connected to the data processing unit 170. The display unit 180 displays the reconstituted image and various kinds of information which are output from the data processing unit 170. The operating unit 190 is operated by operating personnel, and inputs various kinds of commands, information, etc. into the data processing unit 170.

A block diagram of the magnetic resonance imaging apparatus is shown in FIG. 2. This apparatus is an example of an embodiment of this invention. An example of an embodiment relating to the apparatus of this invention is shown by the construction of this apparatus. An example of an embodiment relating to the method of this invention is shown by the operation of this apparatus.

The apparatus shown in FIG. 2 comprises a magnet system 100' different from the apparatus shown in FIG. 1. Apart from the magnet system 100', it has the same construction as the apparatus shown in FIG. 1. Identical symbols are given to identical parts, and their explanation is omitted.

The magnet system 100' comprises a main magnetic field magnet unit 102', gradient coil unit 106' and RF coil unit 108'. These main magnetic field magnet units 102' and coil units are each comprised of pairs facing each other across a gap. They also have a substantially disk-like shape, and are disposed on a common axis. The imaging object 300 is mounted on a cradle 500, and is transported in and out of the internal space of the magnet system 100' by a transport means, not shown.

The main magnetic field magnet unit 102' forms a stationary magnetic field in the internal space of the magnet system 100'. The direction of the stationary magnetic field is essentially perpendicular to the axial direction of the imaging object 300, i.e., a so-called orthogonal magnetic field is formed. The main magnetic field magnet unit 102' for example comprises a permanent magnet, etc. but is of course not limited to a permanent magnet and may also comprise a superconducting electromagnet or permanent conduction electromagnet, etc.

The gradient coil unit 106' generates a gradient magnetic field for giving a gradient to the stationary magnetic field intensity. There are three types of gradient magnetic field generated, and the gradient coil unit 106' comprises three systems of gradient coils, not shown, corresponding to these three types of gradient magnetic fields.

The RF coil unit 108' sends an RF excitation signal for exciting a spin inside the imaging object 300 in the stationary magnetic field space. The RF coil unit 108' also receives a magnetic resonance signal generated by the excited spin. The RF coil unit 108' comprises a sending coil, not shown, and a receiving coil, not shown. The same coil may be used for the sending and receiving coils, or dedicated coils may be used for each.

An example of a pulse sequence used for magnetic resonance imaging is shown in FIGS. 3(A)–3(E). This pulse sequence is a pulse sequence of the spin echo (SE: Spin Echo) method.

Specifically, FIG. 3(A) is a 90 degree pulse and 180 degree pulse sequence for RF excitation in the SE method, and likewise, FIGS. 3(B)–3(E), respectively are slice gradient Gs, read-out gradient Gr, phase encode gradient Gp and spin echo MR sequences, respectively. The 90 degree pulse and 180 degree pulse are respectively represented by center signals. The pulse sequence advances from left to right along the time axis t.

As can be seen from this figure, a 90 degree spin excitation takes place due to the 90 degree pulse. At this time, the slice gradient Gs is applied, and selective excitation occurs for a predetermined slice. After a predetermined time from the 90 degree excitation, 180 degree excitation, i.e. spin inversion, takes place due to the 180 degree pulse. The slice gradient Gs is also applied here, and selective inversion occurs for the same slice.

During the interval between the 90 degree excitation and spin inversion, the read-out gradient Gr and the phase encode gradient Gp are applied. Due to the read-out gradient Gr, dephase takes place. Due to the phase encode gradient Gp, phase encode takes place.

After spin inversion, the spin is rephased by the read-out gradient Gr, and the spin echo MR is generated. The spin echoes MR are collected by the data acquisition unit 150 as view data. The pulse sequence is repeated 64 to 512 times in a period TR (repetition time). The phase encode gradient Gp is varied at each repeat, and a different phase encode is performed each time. In this way, 64 to 512 view data are obtained.

The spin echo MR is an RE signal which has a symmetrical waveform with respect to the echo center. The center echo is produced after a TE (echo time) from the 90 degree excitation. By suitably choosing TE, the phase difference of the water echo and the lipid echo can be made $\pi/2$. When the stationary magnetic field intensity is 0.2T, the TE which makes the phase difference $\pi/2$ is of the order of $2\tau+8.6$ ms or $2\sigma 8.6$ ms. $\tau$ is the time interval from 90 degree excitation to 180 degree excitation. The spin echo obtained from a TE of this order has a sufficient signal intensity.

Another example of the pulse sequence for magnetic resonance imaging is shown in FIGS. 4(A)–4(E). This pulse sequence is a pulse sequence of a gradient echo (GRE: Gradient Echo) method.

Specifically, FIG. 4(A) an a degree pulse sequence for RF excitation in the GRE method, and likewise, FIGS. 4(B)–4(E), respectively, are slice gradient Gs, read-out gradient Gr, phase encode gradient Gp and spin echo MR sequences respectively. The $\alpha$ degree pulse is represented by the center signal. The pulse sequence advances from left to right along the time axis t.

As shown in this figure, $\alpha$ degree excitation of the spin takes place due to the a pulse. $\alpha$ is 90 or less. At this time, the slice gradient Gs is applied and selective excitation of a predetermined slice occurs.

After $\alpha$ excitation, phase encode of the spin is performed by the phase encode gradient Gp. Next, the spin is first dephased by the read-out gradient Gr, then the spin is rephased, and the gradient echo MR is generated. Gradient echoes MR are collected by the data acquisition unit 150 as view data. This pulse sequence is repeated 64 to 512 times in a period TR. The phase encode gradient Gp is varied at each repeat, and a different phase encode is performed each time. In this way, 64 to 512 view data are obtained.

The gradient echo MR is an RF signal which has a symmetrical waveform relative to the echo center. The center echo is generated after TE from α degree excitation. By suitably choosing the time TE, the phase difference of the water echo and the lipid echo can be made π/2. In the case where the stationary magnetic field intensity is 0.2T, the TE which makes the phase difference π/2 is of the order of 8.6 ms. The gradient echo obtained by a TE of this order has sufficient signal intensity.

The view data collected by the pulse sequences of FIGS. 3(A)–3(E), or FIGS. 4(A)–4(E) are collected by the memory of the data processing unit 170. It will of course be understood that the pulse sequence is not limited to the SE method or GRE method, and may consist of other suitable techniques such as the fast spin echo (FSE: FastSpin Echo) method or echo planar imaging (EPI: Echo Planar Imaging) method.

The data processing unit 170 applies a two-dimensional inverse Fourier transformation of the view data so as to reconstruct a tomogram of the imaging object 300. The reconstructed image is stored in memory.

The structure and function of the apparatus so far are an example of an embodiment of the imaging means according to this invention.

From the reconstructed image, the data processing unit 170 respectively generates an image of the water part, and an image of the lipid part. Hereafter, the image of the water part will be referred to as a water image, and the image of the lipid part will be referred to as a lipid image.

In generating the water image and lipid image, the data processing unit 170 calculates a phase distribution, i.e. a phase map, corresponding to the intensity distribution of the stationary magnetic field. It will of course be understood that the phase map may be used not only for water and lipid separation, but also for phase correction in ordinary imaging.

The data processing unit 170 is an example of an embodiment of the phase distribution measuring apparatus of this invention. An example of an embodiment relating to the apparatus of this invention is shown by the construction of the data processing unit 170. An example of an embodiment relating to the method of this invention is shown by the operation of the data processing unit 170.

The data processing unit 170 performs a phase correction which removes the effect of the non-uniformity of the magnetic field using a phase map. The data processing unit 170 is an example of an embodiment of the phase correction apparatus of this invention. An example of an embodiment relating to the apparatus of this invention is shown by the construction of the data processing unit 170. An example of an embodiment relating to the method of this invention is shown by the operation of the data processing unit 170. The data processing unit 170 is also an example of an embodiment of the phase correction means according to this invention.

Figure 5:
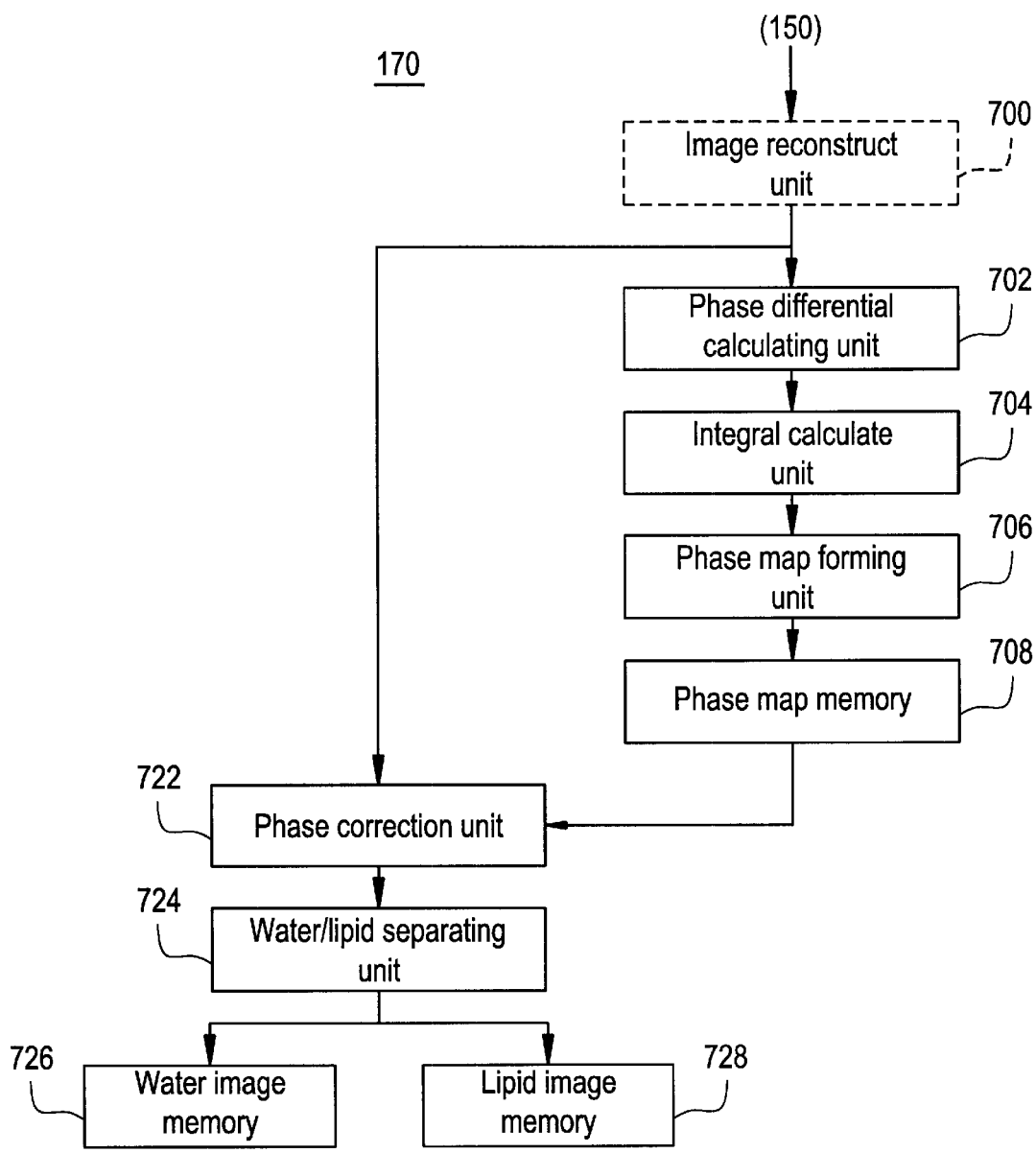
FIG. 5 is a block diagram of a data processing unit in the apparatus shown in FIG. 1 or FIG. 2.

FIG. 5 is a block diagram of the data processing unit 170 seen from the viewpoint of separately generating the water image and lipid image. The function of each block of this diagram may be realized for example by a computer program or the like. This is the same hereafter.

As can be seen from this figure, the data processing unit 170 comprises a phase differential calculating unit 702. The phase differential calculating unit 702 is an example of an embodiment of the differential calculating means according to this invention. The reconstituted image is input to the phase differential calculating unit 702 from the image reconstituting unit 700 of the preceding stage. The reconstituted image may for example be an image obtained by imaging a standard phantom. The standard phantom contains only a water component.

The pixel data of the reconstituted image is given by complex numbers. Specifically, the pixel data comprises a real number component and an imaginary number component. Hereafter, the real number component and imaginary number component will respectively be referred to as a real part and an imaginary part.

Figure 6:
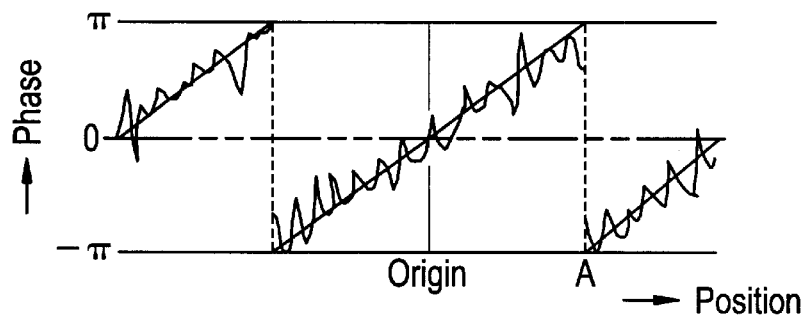
FIG. 6 is a diagram describing the function of the data processing unit shown in FIG. 5.
Figure 17A:
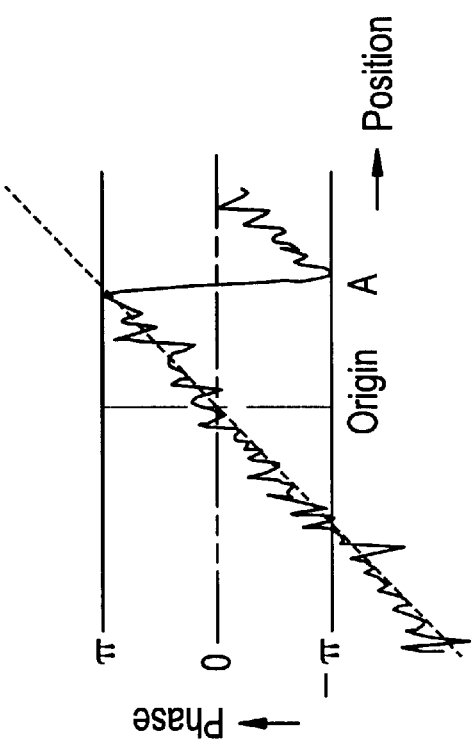
FIGS. 17(a) and 17(b) are a conceptual diagram of a phase map.
Figure 17B:
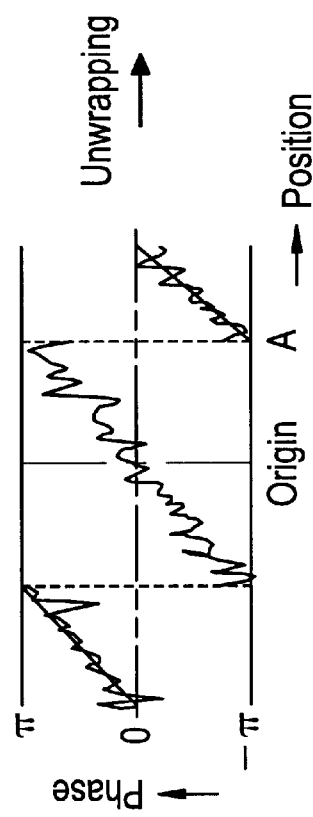

The one-dimensional profile of the phase map of the input image may for example be as shown in FIG. 6. Hereafter, this is simply referred to as a phase map. As in the case of the diagram shown in (a) of FIG. 17, in the phase map, high order components (solid line) are superimposed on a first order component (broken line) of phase, and the map has a wraparound. Due to the high order components of phase, the phase difference between pixels at the wrap-around point A is less than 2π.

The phase differential calculating unit 702 calculates phase differentials for each pixel for each pixel data of the input image. The phase differentials are calculated as follows. For pixel data p1, p2, ... pk, ... pN of the input image, q1, q2, ... qk, ... qN are respectively calculated. qk is given by the following equation.

$$q_k = p_k^* \times p_{k-1} \tag{1}$$

where, pk* is the complex conjugate of pk.

The phase of qk given by equation (1) is taken as the differential of the phase at the pixel position k.

Figure 7:
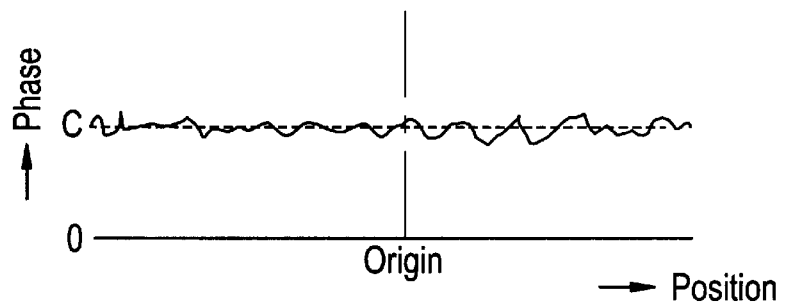
FIG. 7 is a diagram describing the function of the data processing unit shown in FIG. 5.

In this way, the phase differential map shown in FIG. 7 is obtained. As shown by this figure, in the phase differential map, high order components (solid line) are superimposed on a constant C corresponding to the differential of the first order component of phase (broken line). Also, at a point where the phase of qk is 2π+α due to wrap around, the phase term of qk is $$\exp(j(2\pi 10\alpha)) = \exp(j2\pi) \times \exp(j\alpha) = l \times \exp(j\alpha) \tag{2}$$

which is the same as if there is no wraparound.

Integration is performed on these phase differentials by an integral calculating unit 704. The integration is performed with the origin as the starting point. A phase map is formed by a phase map forming unit 706 using the output data of the integral calculating unit 704. The integral calculating unit 704 is an example of an embodiment of the integral calculating means according to this invention. The phase map forming unit 706 is an example of an embodiment of the phase distribution calculating means according to this invention.

Figure 8:
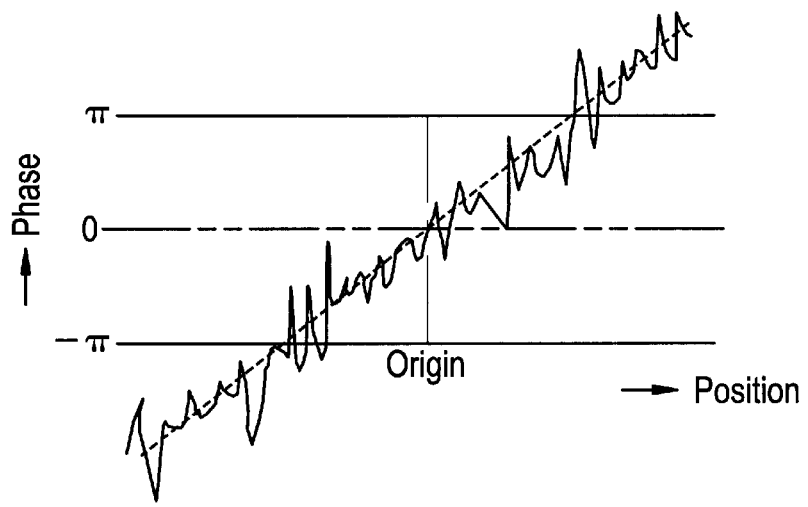
FIG. 8 is a diagram describing the function of the data processing unit shown in FIG. 5.

In this way, the phase map shown in FIG. 8 is for example obtained. In this phase differential map, high order components (solid line) are superimposed on a first order component of phase (broken line) corresponding to the integral of the constant C. As the first order component corresponds to the integral of the constant C, the phase map has no wrap around, and a phase map wherein unwrapping is performed naturally is obtained. In other words, stable unwrapping is performed regardless of whether or not the phase difference is 2π at the point where wrap around would occur.

The phase map is stored by a phase map memory 708. The phase map stored by the phase map memory 708 is used for phase correction of the reconstituted image in the phase correction unit 722. The phase correction unit 722 inputs the reconstituted image to be phase-corrected from the image reconstituting unit 700, and corrects the phase of the pixel data by the phase of the corresponding pixels in the phase map.

The phase-corrected, complex image is input to the water/lipid separating unit 724. The water/lipid separating unit is an example of an embodiment of the image-forming means according to this invention. The water/lipid separating unit generates a water image using the real part and generates a lipid image using the imaginary part of the phase-corrected complex image.

In this way, a precise water image and lipid image can be obtained. The generated water image is stored in a water image memory 726, and the lipid image is stored in a lipid image memory 728.

In the phase map forming step, it is desirable to perform filtering in order to remove the effect of noise. The filtering is performed using a lowpass filter.

Figure 9:
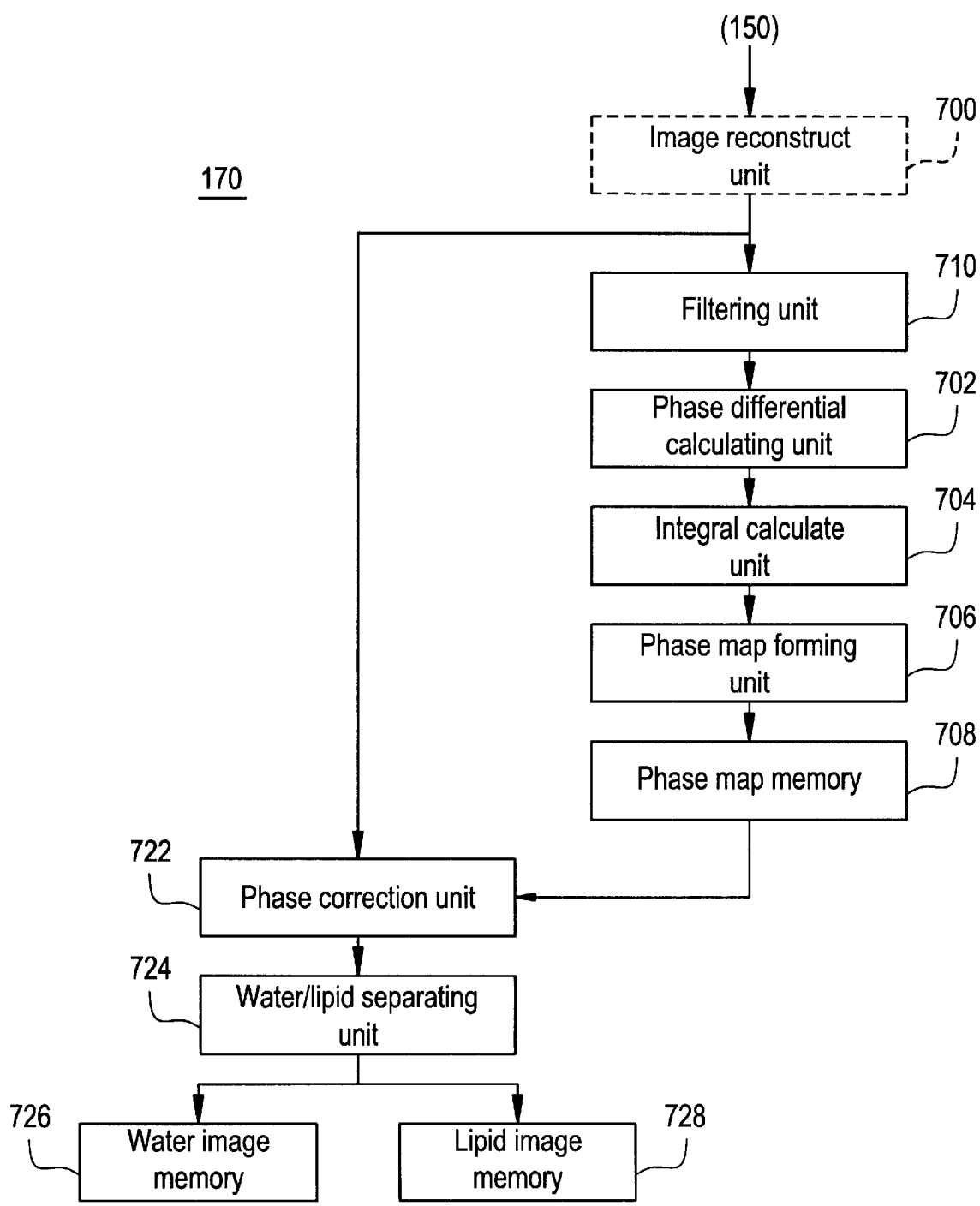
FIG. 9 is a block diagram of the data processing unit in the apparatus shown in FIG. 1 or FIG. 2.

As shown in FIG. 9, filtering is performed for example on the input image of the phase differential calculating unit 702 by a filtering unit 710. The filtering unit 710 is an example of an embodiment of the filtering means according to this invention. By reducing the noise of the input image, high order components of the phase are reduced. Hence, the phase map found via the differential calculating unit 702 and the integral calculating unit 704 is unaffected by noise.

Figure 10:
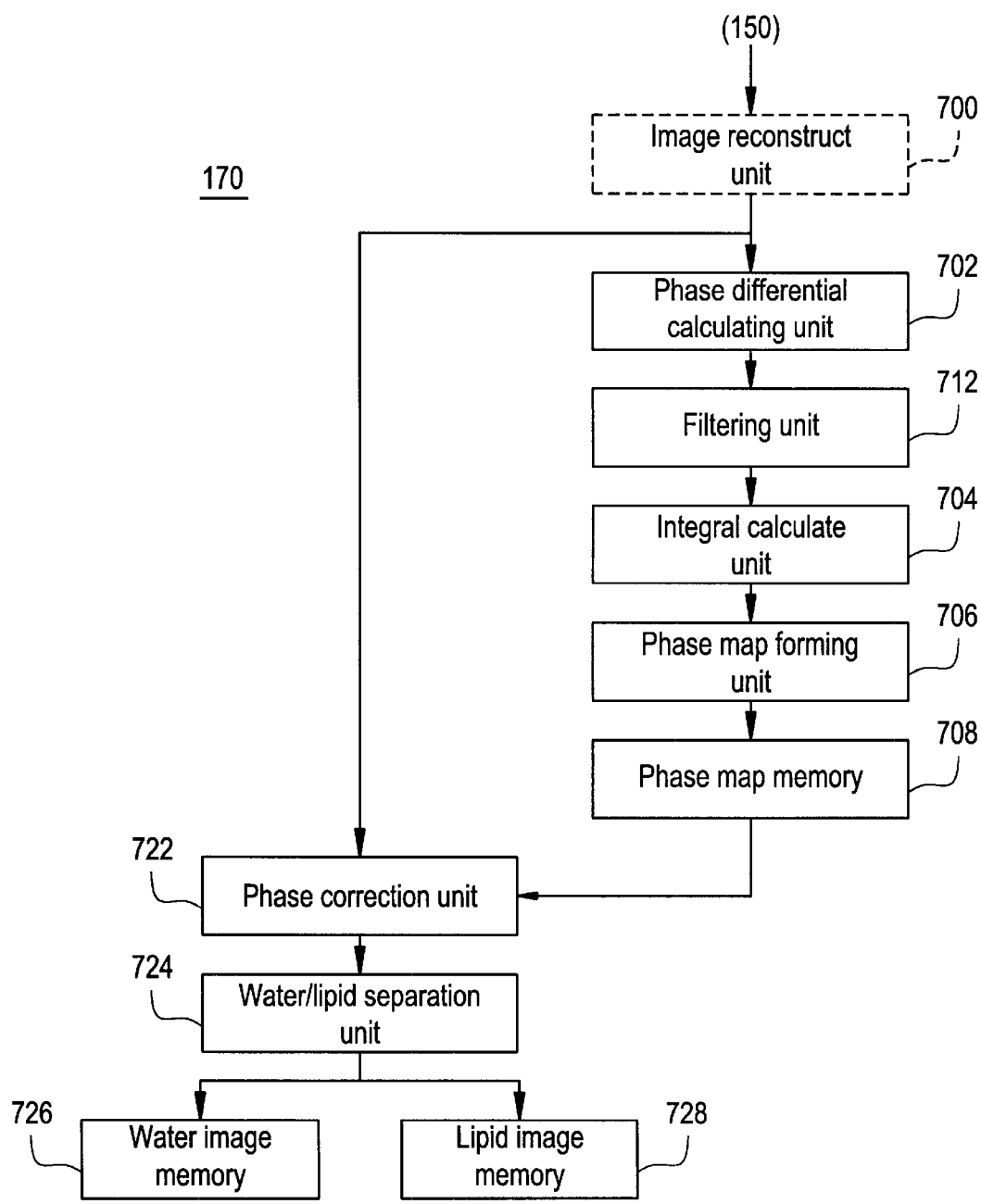
FIG. 10 is a block diagram of the data processing unit in the apparatus shown in FIG. 1 or FIG. 2.

Filtering may also be performed for example on the output data of the phase differential calculating unit 702, as shown in FIG. 10. A filtering unit 712 is an example of an embodiment of the filtering means according to this invention. The filtering unit 712 performs filtering on the aforesaid qk. Phases of filtered values fqk are then input as phase differentials to the integral calculating unit 704. By reducing the noise of the phase differential in this way, the phase map found via the integral calculating unit 704 is unaffected by noise.

Figure 11:
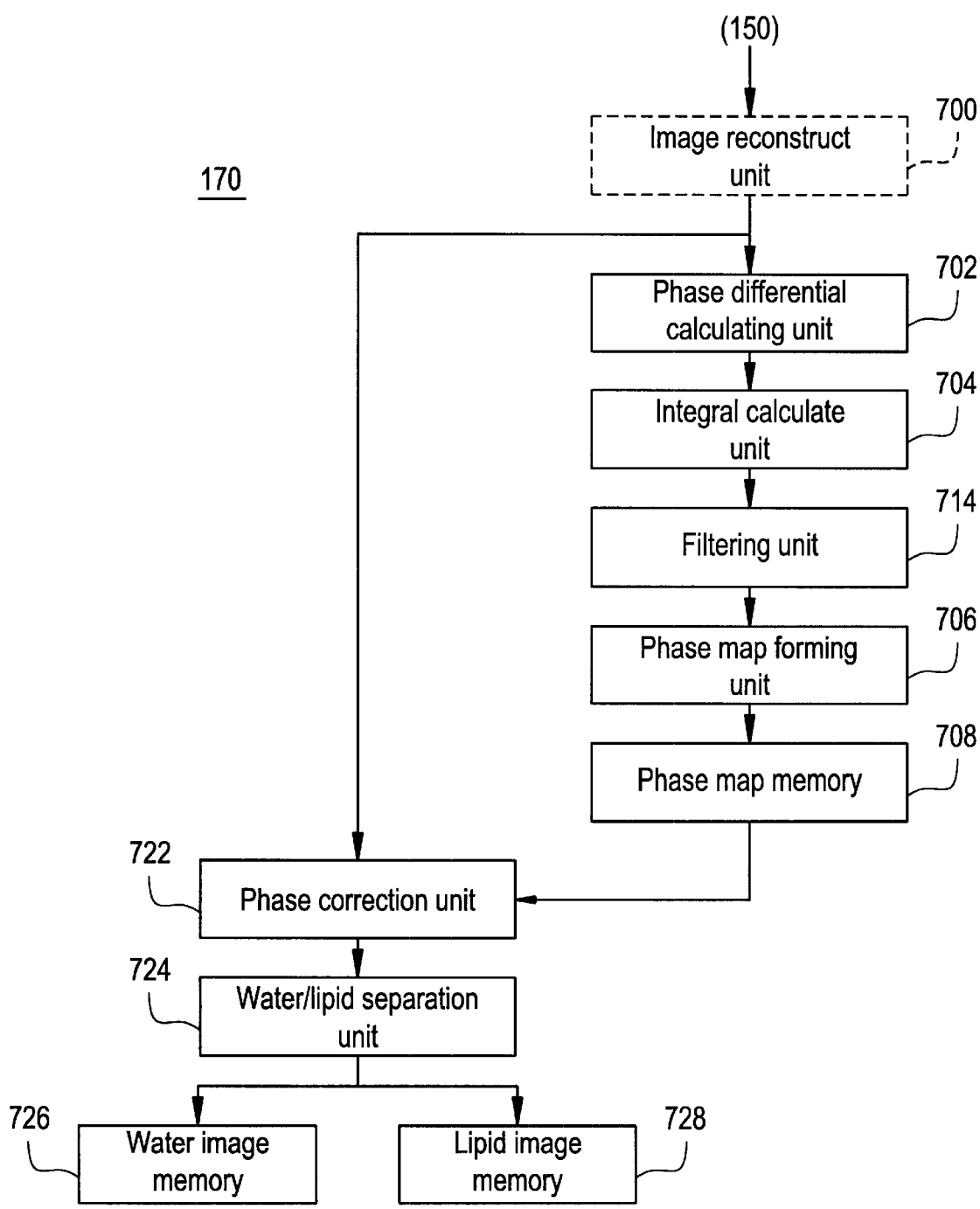
FIG. 11 is a block diagram of the data processing unit in the apparatus shown in FIG. 1 or FIG. 2.

Filtering may also be performed for example on the output data of the integral calculating unit 704, as shown in FIG. 11. The filtering unit 714 is an example of an embodiment of the filtering means according to invention. The filtering unit 712 filters complex data having phases given by the output data of the integral calculating unit 704, and performs filtering by individually calculating the phases of the filtered complex data. In this way, the phase map is unaffected by noise.

When an image obtained from the imaging object 300 is used as an original image to calculate the phase map, the water image and lipid image have a phase difference of π/2 due to the aforesaid pulse sequence, so the phase map has a phase wherein π/2 is added to the phase due to the non-uniformity of the stationary magnetic field at a point corresponding to the lipid image.

If a phase correction is performed by such a phase map, even the phase difference of the water image and lipid image is corrected, so separate water and lipid images can no longer be obtained. Therefore, the following processing is applied when finding the phase map from the image obtained from the imaging object 300.

Figure 12:
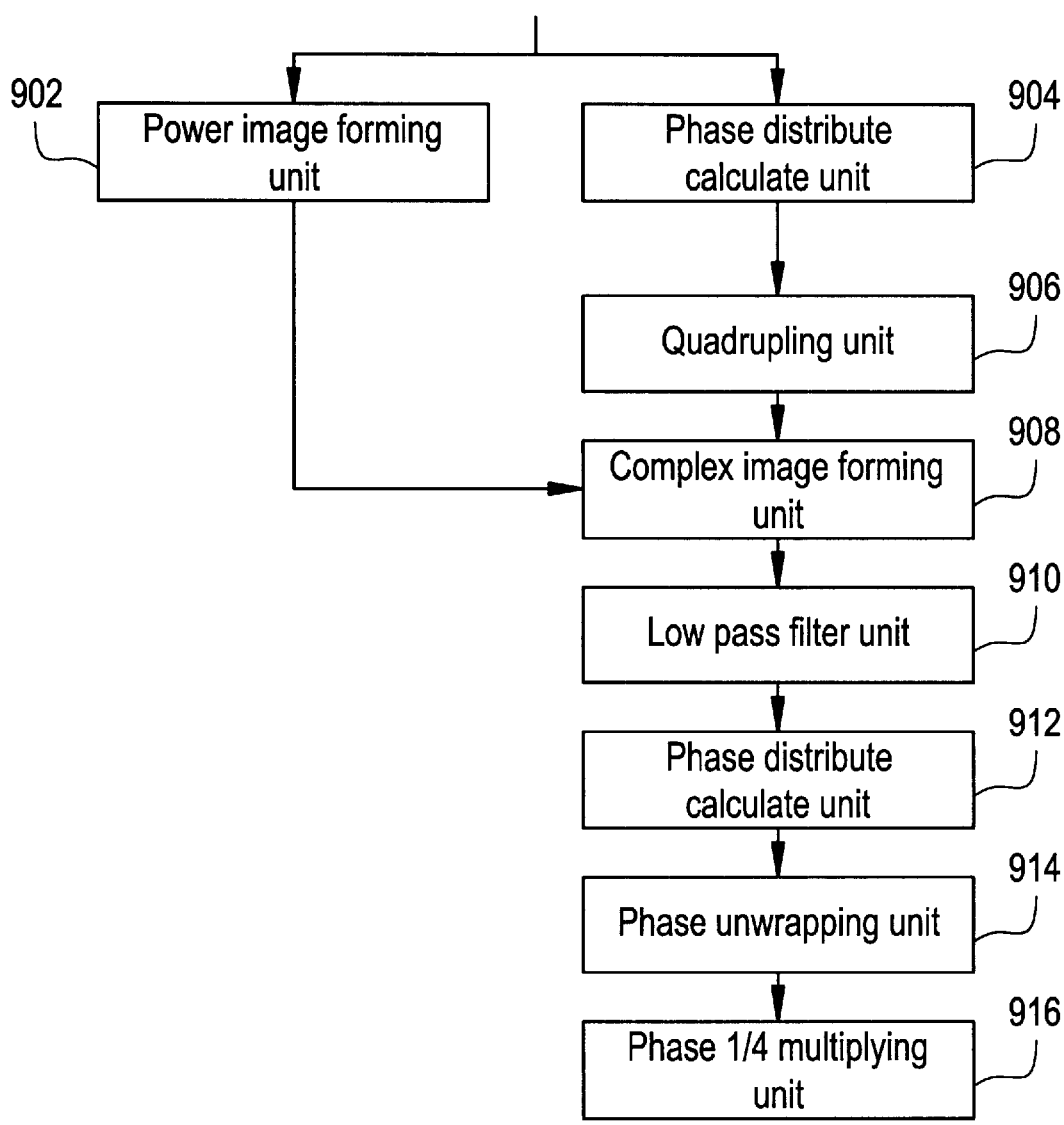
FIG. 12 is a block diagram of the data processing unit in the apparat is shown in FIG. 1 or FIG. 2.

FIG. 12 shows a block diagram of the data processing unit 170 from the viewpoint of finding the phase map from an image wherein the water image and lipid image have a phase difference of π/2. As shown in this figure, the data processing unit 170 comprises a power image forming unit 902 and a phase distribution calculating unit 904.

The reconstituted image is input to the power image forming unit 902 and the phase distribution calculating unit 904.

The power image forming unit 902 calculates the power of the complex data for each pixel, and forms an image wherein this power is a pixel value, i.e., a power image. The phase distribution calculating unit 904 calculates the phase distribution of the reconstituted image.

Figure 13B:
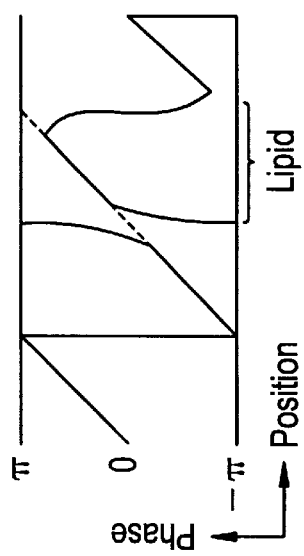
FIGS. 13(a) and 13(b) are a diagram describing the function of the data processing unit shown in FIG. 12.
Figure 13A:
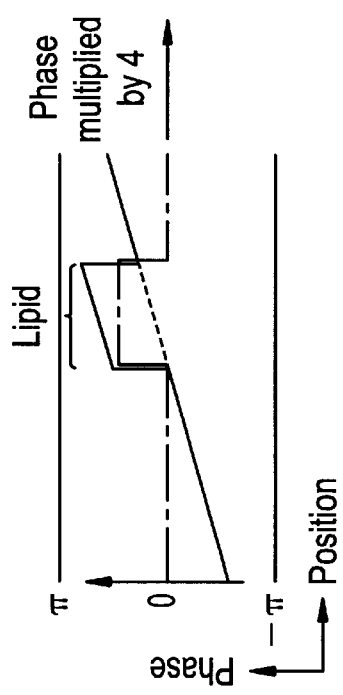

A schematic view of the phase distribution is shown in FIG. 13(*a*). This figure is a one-dimensional profile of the phase distribution when the tomogram comprises a lipid image and a water image surrounding it.

If, in the one-dimensional profile of the phase distribution (referred to hereafter simply as phase distribution), the stationary magnetic field is uniform, when the phase of the water image is 0, the profile should have a pattern shown by the dot-and-dash line of this figure, however if the stationary magnetic field has a non-uniformity with a linear slope, for example, a phase distribution shown by the solid line is obtained.

The phase distribution is input to a phase quadrupler 906. The phase quadrupler 906 quadruples each phase in the phase distribution. Therefore, the phase distribution shown by FIG. 13(*b*) is obtained. As shown in this figure, due to quadrupling, the phase difference of water and lipid is 2π so they have an identical phase. It should be noted that a wrap around occurs in the phase distribution. In addition, at the boundary of water and lipid, a discontinuity or sharp change of phase occurs.

This phase distribution is input to a complex image forming unit 908'. The power image from the power image forming unit 902 is also input to the complex image forming unit 908. The complex image forming unit 908 forms a complex image based on the phase distribution and the power image.

The real part of the complex image is calculated as the cosine of the power image data. The imaginary part of the complex image is calculated as the sine of the power image data. The angle used for computing the cosine and sine is a phase angle.

Figure 14B:
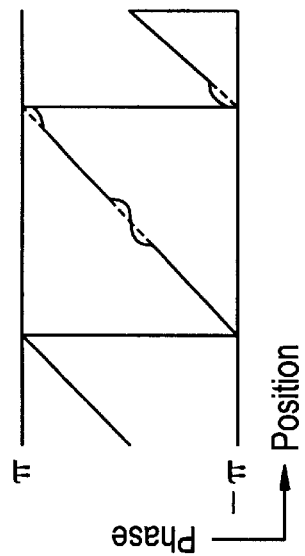
FIGS. 14(a) and 14(b) are a diagram describing the function of the data processing unit shown in FIG. 12.
Figure 14A:
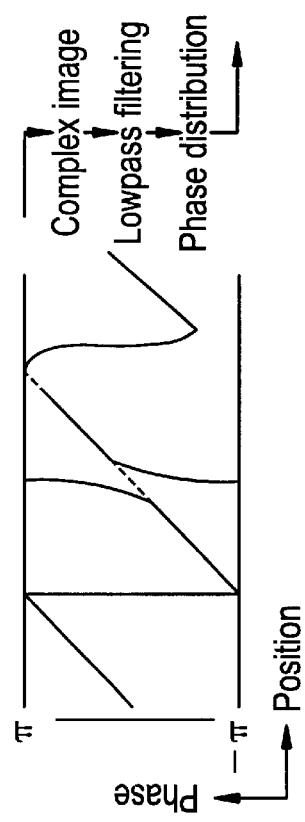

The complex image is input to a phase distribution calculating unit 912 via a lowpass filter unit 910. The phase distribution calculating unit 912 forms a phase distribution from the complex image subjected to lowpass filtering. Due to lowpass filtering, in the phase distribution, the discontinuity or sudden change of phase shown in FIG. 14(*a*) is smoothed out as shown for example in FIG. 14(*b*).

Figure 15A:
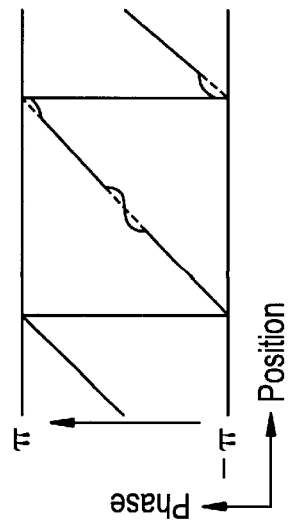
FIGS. 15(a)–15(c) are a diagram describing the function of the data processing unit shown in FIG. 12.
Figure 15B:
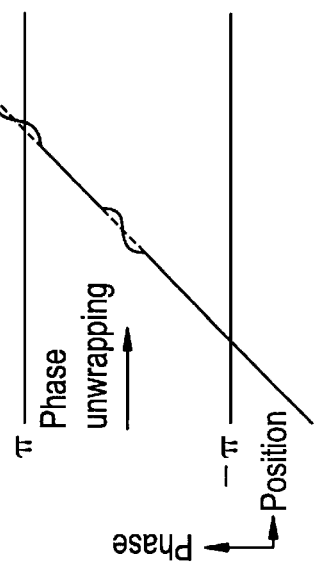
Figure 15C:
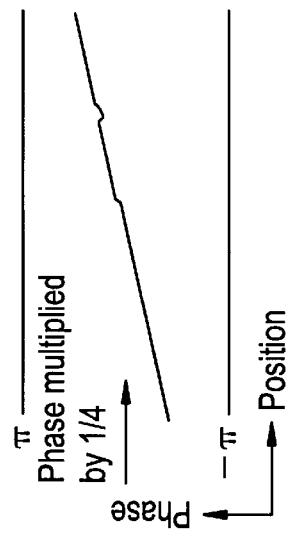

This phase distribution is input to a phase unwrapping unit 914. The unwrapping unit 914 unwraps the phase with wrap around shown in FIG. 15(*a*), so that it is unwrapped as shown in FIG. 15(*b*).

The unwrapped phase distribution is input to a ¼ phase multiplier 916. The ¼ phase multiplier 916 multiplies the input phase by ¼. As a result, the phase distribution shown in FIG. 15(*c*) is obtained. This phase distribution corresponds to the phase distribution when the imaging object 300 is only water. Therefore, this phase distribution represents the intensity distribution of the stationary magnetic field, i.e., the non-uniformity of the stationary magnetic field.

Figure 16B:
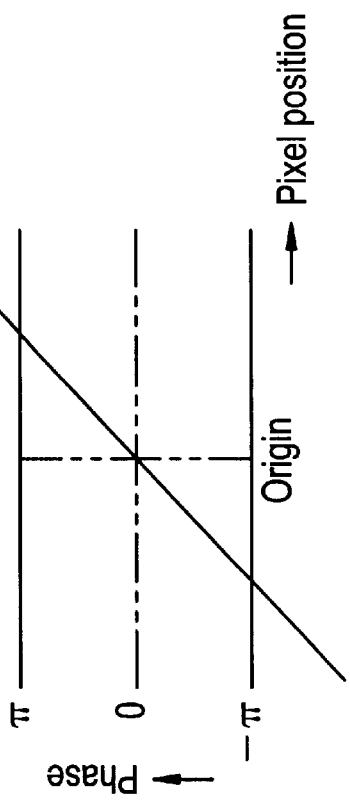
FIGS. 16(a) and 16(b) are a conceptual diagram of a phase map.
Figure 16A:
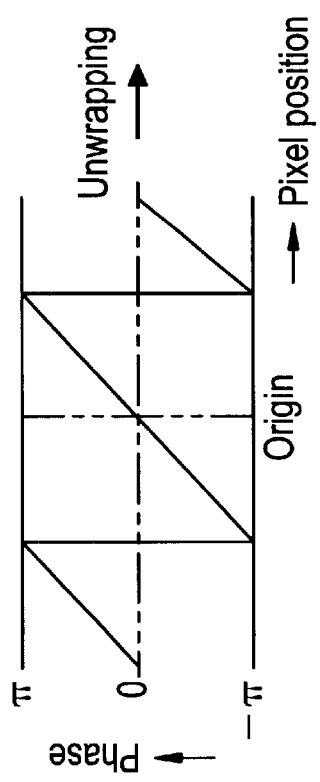

By replacing the construction after the phase quadrupler 906 of the data processing unit 170 which performs this processing, by the phase map forming unit 706 in FIG. 5, FIG. 9, FIG. 10 and FIG. 11, a phase map unaffected by the lipid image can be obtained. FIGS. 16(*a*) and 16(*b*) and FIGS. 17(*a*) and 17(*b*), show the phase unwrapping for conceptual diagrams, in other examples.

Many widely deferent embodiments of the invention may be constructed without departing from the spirit and scope of the present invention. It should be understood that the present invention is not limited to the specific embodiments described in the specification, except as defined in the appended claims.

What is claimed is:

1. A phase control method comprising the steps of:
   calculating differentials of phases of pixel data in an image obtained by magnetic resonance imaging for each pixel;
   calculating integrals of said differentials for each pixel;
   filtering one or more of the following: said image, said differential of each pixel, and said integral of said differential of each pixel; and
   forming a phase distribution from said integrals, whereby said phase distribution comprises a high order component superimposed on a first order component so that stable unwrapping is obtained.

2. The method of claim 1, wherein said filtering is of said image and is before said step of calculating said differentials of phases of pixel data in said filtered image.

3. The method of claim 1, wherein said filtering is of said differential of each pixel and is before said step of calculating integrals of filtered differentials for each pixel.

4. The method of claim 1, wherein said filtering is of said integrals of said differentials and is before said step of forming said phase distribution from said integrals.

5. The method of claim 1, further comprising the step of performing a phase correction of said image using said phase distribution.

6. A phase control apparatus comprising:
   means for calculating differentials of phases of pixel data in an image obtained by magnetic resonance imaging for each pixel;
   means for calculating integrals of said differentials for each pixel;
   means for filtering one or more of the following: said image, said differential of each pixel, and said integral of said differential of each pixel; and
   means for forming a phase distribution from said integrals, whereby said phase distribution comprises a high order component superimposed on a first order component so that stable unwrapping is obtained.

7. The apparatus of claim 6, wherein said means for filtering comprises means for filtering said image before said calculating of said differentials of phases of pixel data in said filtered image.

8. The apparatus of claim 6, wherein said means for filtering comprises means for filtering said differential of each pixel before said calculating of said integrals of filtered differentials for each pixel.

9. The apparatus of claim 6, wherein said means for filtering comprises means for filtering said integrals of said differentials before said forming of said phase disbribution from said integrals.

10. The apparatus of claim 6, further comprising means for performing a phase correction of said image using said phase distribution.

11. A magnetic resonance imaging apparatus comprising:
    means for forming an image of each imaging object using magnetic resonance;
    means for calculating differentials of phases of pixel data in said image obtained by magnetic resonance imaging for each pixel;
    means for calculating integrals of said differentials for each pixel;
    means for filtering one or more of the following: said image, said differential of each pixel, and said integral of said differential of each pixel;
    means for forming a phase distribution from said integrals, whereby said phase distribution comprises a high order component superimposed on a first order component so that stable unwrapping is obtained;
    means for performing phase correction of said image using said phase distribution; and
    means for separately generating a water image and a lipid image using phase difference of pixel data of said phase corrected images.

12. The apparatus of claim 11, wherein said means for filtering comprises means for filtering said image before calculating said differentials of phases of pixel data in said filtered image.

13. The apparatus of claim 11, wherein said means for filtering comprises means for filtering said differential of each pixel before said calculating of said integrals of filter differentials for each pixel.

14. The apparatus of claim 11, wherein said means for filtering comprises means for filtering said integrals of said differentials before forming of said phase distribution from said integrals.

15. A phase control method comprising the steps of:
    forming a power image from a reconstructed image;
    means for calculating phase distribution;
    quadruplying the calculated phase distribution;
    forming a complex image using the results of said power image forming step and said quadruplying step;
    filtering the results of said complex image forming;
    calculating phase distribution from the filtered results;
    phase unwrapping the calculated phase distribution; and
    fractionally phase multiplying the phase unwrapped results.

16. A phase control apparatus comprising:
    means for forming a power image from a reconstructed image;
    means for calculating phase distribution;
    means for quadruplying the calculated phase distribution;
    means for forming a complex image using the results of said power image forming and said quadruplying;
    means for filtering the results of said complex image forming;
    means for calculating phase distribution from the filtered results;
    means for phase unwrapping the calculated phase distribution; and
    means for fractionally phase multiplying the phase unwrapped results.

* * * * *